United States Patent [19]

Inou et al.

[11] Patent Number: 5,604,374
[45] Date of Patent: Feb. 18, 1997

[54] SEMICONDUCTOR DEVICE AND MANUFACTURING METHOD THEREOF

[75] Inventors: Kazumi Inou, Yokohama; Yasuhiro Katsumata, Chigasaki, both of Japan

[73] Assignee: Kabushiki Kaisha Toshiba, Kawasaki, Japan

[21] Appl. No.: 399,659

[22] Filed: Mar. 7, 1995

[30] Foreign Application Priority Data

Mar. 15, 1994 [JP] Japan .................... 6-044367

[51] Int. Cl.⁶ .................... H01L 27/082; H01L 29/70
[52] U.S. Cl. .................... 257/593; 257/592; 257/588; 257/586; 257/526; 257/518
[58] Field of Search .................... 257/593, 592, 257/588, 587, 576, 526, 517, 518, 586

[56] References Cited

U.S. PATENT DOCUMENTS

| | | | |
|---|---|---|---|
| 4,252,581 | 2/1981 | Anantha et al. | 437/72 |
| 4,824,799 | 4/1989 | Komatsu | 437/162 |
| 4,851,362 | 7/1989 | Suzuki | 437/31 |
| 4,853,342 | 8/1989 | Taka et al. | 437/31 |
| 4,860,086 | 8/1989 | Nakamura et al. | 257/518 |
| 4,974,045 | 11/1990 | Okita | 257/518 |
| 5,198,689 | 3/1993 | Fujioka | 257/197 |
| 5,234,845 | 8/1993 | Akoi et al. | 437/33 |
| 5,485,034 | 1/1996 | Maeda et al. | 257/592 |

FOREIGN PATENT DOCUMENTS

| | | |
|---|---|---|
| 63-84156 | 4/1988 | Japan . |
| 1-187864 | 7/1989 | Japan .................... 257/592 |
| 2-40923 | 2/1990 | Japan . |
| 2-151037 | 6/1990 | Japan . |

OTHER PUBLICATIONS

Anonymous, "High–Performance Bipolar Transistor with Metal–Silicide Collector Contact," IBM Technical Disclosure Bulletin, vol. 33, No. 12, May 1991, pp. 333–334.

Chang, J. J., "Self-Aligned Bipolar Transistor," IBM Techical Disclosure Bulletin, vol. 21, No. 7, Dec. 1978, pp. 2761–2762.

Primary Examiner—Jerome Jackson
Assistant Examiner—John Guay
Attorney, Agent, or Firm—Oblon, Spivak, McClelland, Maier & Neustadt, P.C.

[57] ABSTRACT

A semiconductor device comprises a semiconductor substrate having a main surface, a first semiconductor region of a first conductive type, formed on the main surface of the semiconductor substrate, a surrounding of the first semiconductor region is buried with a first insulation film, a second semiconductor region of a second conductive type, formed on the first insulation film and the first semiconductor region, a second insulation film, formed on the second semiconductor region, an end portion of the second insulation film is positioned above the first insulation film, and having an opening at a central portion thereof to be positioned above the first semiconductor region, and a third semiconductor region of a first conductivity type formed on a surface of the second semiconductor region exposed through the opening of the second insulation film.

16 Claims, 6 Drawing Sheets

SEMICONDUCTOR DEVICE AND MANUFACTURING METHOD THEREOF

BACKGROUND OF THE INVENTION

1. Field of the Invention

The present invention relates to a semiconductor device, which is suitably used as a device constituting a bipolar LSI, and a manufacturing method thereof.

2. Description of the Related Art

In order to realize a high speed LSI to be used in a mobile communication field or an emitter coupled logic gate array, the development of the technique of a high speed silicon bipolar transistor has been remarkably advanced. In order to improve an operation speed of the bipolar transistor, it is required that a capacitance between a base and a collector and a base resistance be reduced. In order to meet the requirement, there has been proposed a transistor structure in which a collector layer formed by an epitaxial growth technique is surrounded with a device separation region whereby a fine collector region is formed, a base region is formed thereon by a selective epitaxial growth technique, a fine emitter region is formed thereby reducing the capacitance between the base and the collector, and a base lead region is formed beside the base region for a thickness of the base lead region to be thicker than the thickness of the base region thereby reducing the base resistance.

Figure 1:
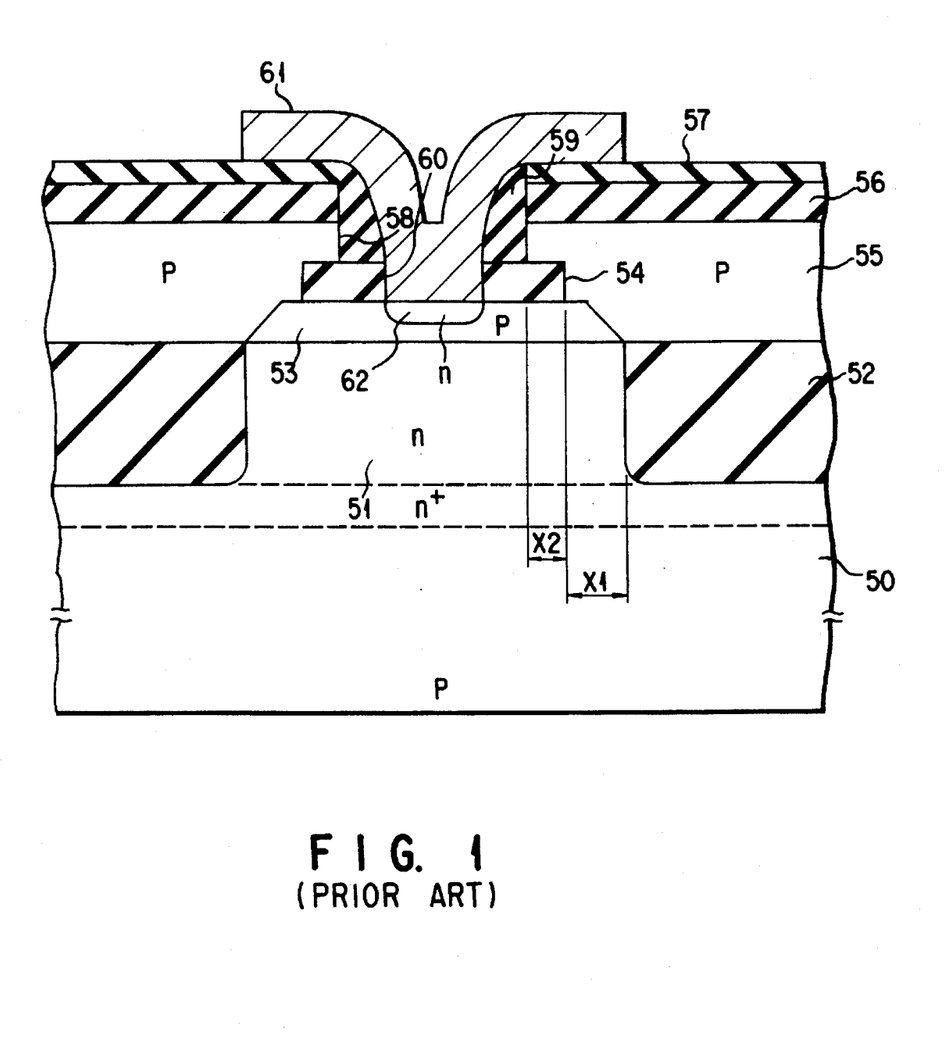
FIG. 1 is a cross sectional view showing an npn type bipolar transistor using a conventional selective epitaxial growth technique.

FIG. 1 is a cross sectional view showing such a transistor structure. First, a collector region 51 is formed on a silicon substrate 50 including an n-type buried layer having a high impurity concentration by means of epitaxial growth, and the collector region 51 is insulated and surrounded by a buried oxide layer 52 serving as an element isolation region. Then, a silicon monocrystal region, serving as a base region 53, is formed on only the collector region 51 by a selective epitaxial growth technique.

Next, an insulation film is deposited on the entire surface, and a predetermined patterning is provided thereto, so that an etching stopper film 54 is formed on the base region 53. At this time, since a positioning allowance in a lithography processing and a contact area between an external base lead region and the base region 53 is needed, the etching stopper film 54 is formed to be smaller than the collector region 51, and a distance X1 is needed as shown in FIG. 1.

After that, a polycrystalline silicon layer, serving as a base lead region 55, is deposited, a p-type impurity material is ion-implanted, and an oxide film 56 and a nitride film 57 are sequentially deposited by use of CVD. Thereafter, an opening 58 is formed to form an emitter region. Then, a silicon nitride film is deposited by use of CVD, and a side wall spacer 59 is formed by use of anisotropic etching. The etching stopper film 54 is etched by wet-typed etching without damaging the base region 53, so that an opening 60 is formed.

Thereafter, a polycrystalline silicon layer 61 is deposited, an n-type impurity material is ion-implanted. Then, the impurity material is diffused by thermal treatment, and an emitter region 62 is formed in the base region 53. After that, the polycrystalline silicon layer 61 including the n-type impurity material is patterned to have a predetermined shape. Thereafter, well-known metal electrode forming is performed, so that a transistor is completed.

According to the above-explained manufacturing method, since an extremely thin base layer can be formed, a higher cut-off frequency than that of the transistor having a base layer formed by conventional ion-implantation and diffusion techniques can be obtained.

However, there are problems as set forth below in the above-mentioned structure and manufacturing method thereof.

More specifically, there are needed the distance X1, which is involved in patterning the etching stopper film 54 to be smaller than the collector region 51 serving as an active region of the transistor, and the distance X2, which is involved in estimating a shift of the positioning in the lithography processing for providing the opening 58 for the emitter region. Due to this, the sum of distances X1 and X2 (X1+X2) prevented the structure from being fined. As a result, the capacitance between the base and the collector, and the base resistance, were not sufficiently reduced, and the deterioration of the entire circuit performance was caused. Moreover, in the region just below the emitter, which substantially functions as a transistor, the peripheral portion thereof became large, and a parasitic portion was enlarged.

SUMMARY OF THE INVENTION

An object of the present invention is to provide a semiconductor device and manufacturing method thereof wherein necessity of providing a positioning allowance in a lithography processing is eliminated to improve miniaturization of the device and to reduce a capacitance between a base and a collector, thereby making it possible to obtain a high-speed operation in a bipolar transistor semiconductor device using an epitaxial growth technique.

In order to attain the above object, according to the present invention, there is provided a semiconductor device comprising a semiconductor substrate having a main surface; a first semiconductor region of a first conductive type, formed on the main surface of the semiconductor substrate, the first semiconductor region being surrounded with a first insulation film; a second semiconductor region of a second conductive type, formed on the first insulation film and the first semiconductor region; a second insulation film, formed on the second semiconductor region, an end portion of the second insulation film being positioned just above the first insulation film, and having an opening at a central portion thereof to be positioned just above the first semiconductor region; and a third semiconductor region of a first conductivity type formed on a surface of the second semiconductor region exposed through the opening of the second insulation film.

The desirable embodiments of this invention are as follows:

(1) The second insulation film is a composite film of an oxide film and a nitride film;

(2) The second insulation film is the oxide film containing an impurity material whose conductivity type is the same as that of an impurity material forming the second semiconductor region of the second conductivity type;

(3) The second semiconductor region (base region) is formed of a monocrystal semiconductor layer having an original base function and a polycrystalline semiconductor layer corresponding to a base lead region, and at least one part of a boundary therebetween exists just under the second insulation film;

(4) The width of the first semiconductor region (collector region) is substantially the same as that of the third semiconductor region (emitter region);

(5) A conductive layer (a base lead region) is formed on at least one portion of a peripheral portion of the second insulation film;

(6) The conductive layer is formed of polycrystalline silicon of a second conductive type or high melting point material; and (7) The semiconductor device further comprises a fourth concentration semiconductor region of a second conductivity type whose impurity concentration is higher than that of said second semiconductor region, in the second semiconductor region just under the second insulation film.

Moreover, according to the present invention, there is provided a method for manufacturing a semiconductor device comprising the steps of forming a first semiconductor region of a first conductive type on a silicon substrate; forming a first insulation film on the silicon substrate to surround the first semiconductor region so as to insulate and separate the first semiconductor region; forming a monocrystal silicon layer of a second conductive type on the insulated and separated first semiconductor region and a polycrystalline silicon layer of a second conductive type on the first insulation film by a non-selective epitaxial growth technique so as to form a second semiconductor region; forming a second insulation film on the second semiconductor region to be patterned such that the second insulation film is positioned above the first semiconductor region and an end portion of the second insulation film is positioned above the first insulation film; forming a conductive layer on the second insulation film and the second semiconductor region; forming a first opening in a portion of the conductive layer positioned above the first semiconductor region to expose a part of the second insulation film; forming a side wall insulation film in the first opening; forming a second opening in the second insulation film by removing a portion of the second insulation film, exposed in the first opening and surrounded by the side wall insulation film, by use of etching; and forming a polycrystalline silicon layer containing an impurity material of a first conductive type on a region where the second insulation film is removed so as to form a third semiconductor region of a first conductive type in the second semiconductor region by means of thermal diffusion According to the present invention, there is no need of estimating a shift of positioning in a lithography processing as is needed for a conventional transistor having a base formed by the selective epitaxial growth technique. In other words, the end portion of the second insulation film is positioned above the insulation film for device separation. Thereby, there is no need of estimating a shift of positioning between the insulation film for device separation and the second insulation film, and there can be eliminated the limitation of miniaturizing the device caused by estimating the positioning allowance. Moreover, since the contact region with the base lead region can be widely obtained by the non-selective epitaxial growth technique, there is no need of providing a special contact area, which is needed in the prior art. Therefore, the transistor area can be largely reduced, so that capacitance between the base and the collector can be reduced, and the circuit performance can be considerably improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B are views showing an npn type bipolar transistor structure of a first embodiment of the present invention.

DETAILED DESCRIPTION OF THE PREFERRED EMBODIMENTS

Embodiments of the present invention will be explained with reference to the drawings. The same reference numerals are added to the common portions through the whole embodiments to omit the duplication of the explanation.
(First Embodiment)

Figure 2A:
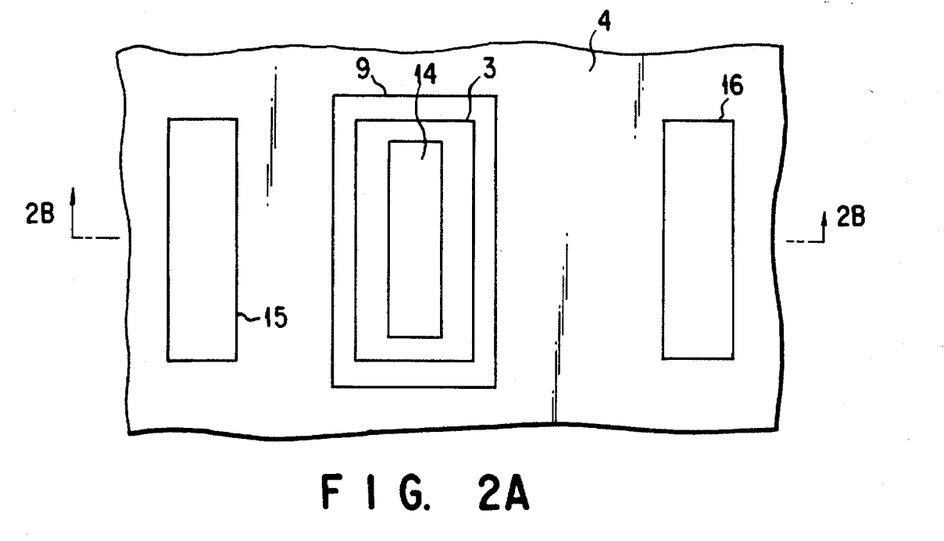
FIG. 2A is a schematic plan view.
Figure 2B:
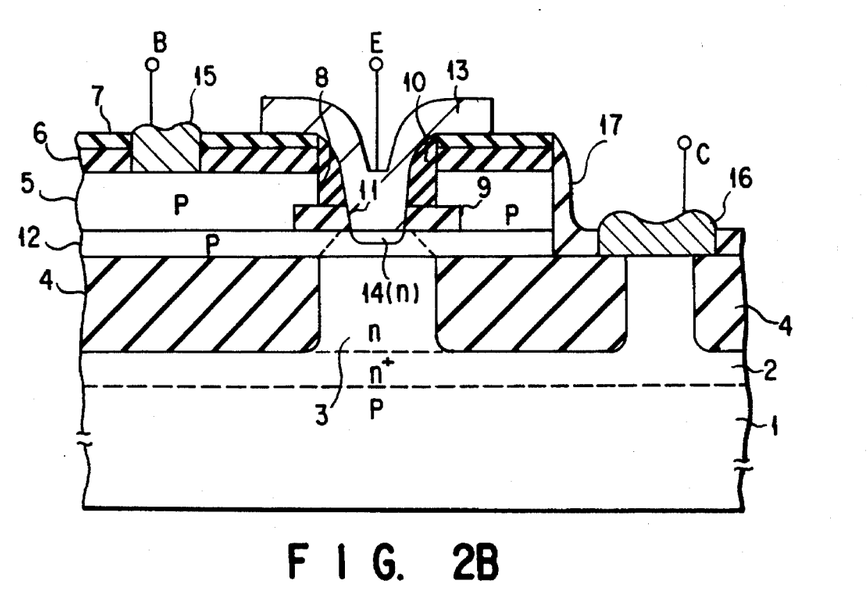
FIG. 2B is a cross sectional view taken along a line 2B—2B of FIG. 2A.

FIGS. 2A and 2B are views showing an npn type bipolar transistor structure of a first embodiment of the present invention, wherein FIG. 2A is a schematic plan view, and FIG. 2B is a cross sectional view taken along a line 2B—2B of FIG. 2A.

An n+ type buried layer 2 is formed on a p-type silicon substrate 1, and an n-type collector region 3 (a first semiconductor region) is formed thereon. The side surface of the collector region 3 is surrounded with a buried insulation film 4 (a first insulation film) whose thickness is substantially the same as that of the collector region 3, whereby a device separation is performed. A base region 12 (a second semiconductor region), which is formed of a p-type silicon crystal, is formed on the collector region 3 and the buried insulation film 4. At this time, the base region 12 on the collector region 3 is formed as a monocrystal, and the base region 12 on the buried insulation film 4 is formed as a polycrystalline film. An etching stopper film 9 (a second insulation film) is formed on the base region 12. The etching stopper film 9 is formed to be positioned just above the collector region 3, and its end portion is extended to an upper portion of the buried insulation film 4.

A base lead region 5, which is formed of a p-type polycrystalline silicon layer, is formed on the base region 12 and the etching stopper film 9, and an oxide film 6 and a nitride film 7 are sequentially formed thereon. A first opening 8 is formed above the etching stopper 9 to be through the base lead region 5, the oxide film 6 and the nitride film 7, and a side wall spacer 10 (side wall insulation film) is formed on a side wall of the opening 8. Moreover, an exposed portion of the etching stopper film 9 is removed, and a second opening 11, in which an emitter is to be formed, is formed. A polycrystalline silicon film 13 is formed to bury the openings 8 and 11, and an n-type emitter region 14 (a third semiconductor region) is formed in the base region 12 by means of diffusion from the polycrystalline silicon film 13. In FIG. 2B, reference numeral 15 is a base electrode, 16 is a collector electrode, and 17 is an insulation film.

The following will explain the manufacturing method of the device of the first embodiment with reference to FIGS. 3A to 3H.

Figure 3A:
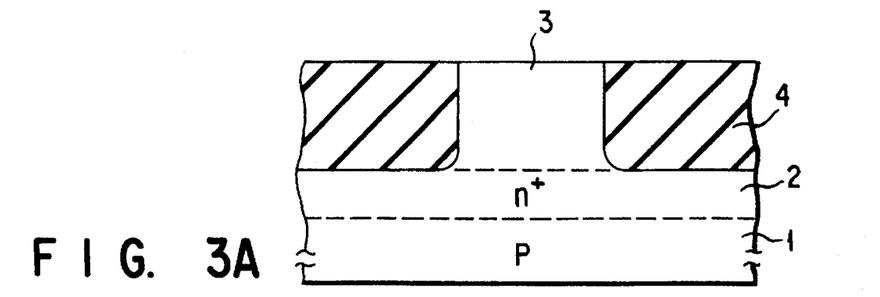
FIGS. 3A to 3H are cross sectional views stepwise showing a manufacturing process of the device of the first embodiment.

First, as shown in FIG. 3A, the n+ type buried layer 2 having high impurity concentration ($1\times10^{19}$ atoms/cm$^3$ and more) and a thickness of 2 µm is formed on the p-type silicon substrate 1, and the n-type collector region 3 having impurity concentration ($1\times10^{16}$ to $3\times10^{17}$ atoms/cm$^3$) and a thickness of 0.5 to 1.0 µm is formed thereon by an epitaxial growth technique. Thereafter, the peripheral portion of the collector region 3 is etched, whereby a device separation groove is formed. Then, the insulation film is deposited on an entire surface to bury the groove, and is etched back to be flush with the collector region 3, so that the buried insulation film 4 is formed. By the buried insulation film 4, the active region of the bipolar transistor is insulated. In this embodiment, the size of the collector region 3 was 0.5×1.3 µm$^2$.

Figure 3B:
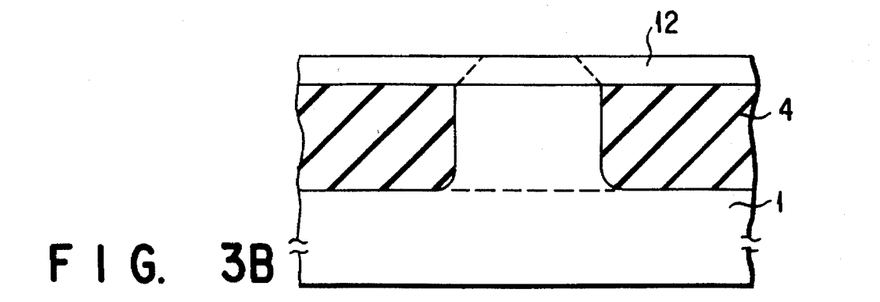

Thereafter, as shown in FIG. 3B, a silicon crystal layer is grown by a non-selective epitaxial growth technique, so that the base region 12 having high impurity concentration ($1\times10^{18}$ to $7\times10^{18}$ atoms/cm$^3$) and a thickness of 30 to 100 nm is formed. At this time, a monocrystal layer is grown on the active region (a collector region 3), and a polycrystalline silicon layer is grown on the buried insulation film 4. A dotted line in the base region 12 shows a boundary between the monocrystalline region and the polycrystalline region. At this time, for example, diborane ($B_2H_6$) is mixed into a material gas, so that the base region 12 is doped to be p-typed as an epitaxial layer is grown at a predetermined pressure, a predetermined temperature, and a predetermined gas flow rate. As one example, treatment is performed under the conditions of disilane ($Si_2H_6$) whose partial pressure is $2.5\times10^{-3}$ Pa, diborane ($B_2H_6$) whose partial pressure is $2.5\times10^{-2}$ Pa, and a temperature of 550° to 700° C. Moreover, if monogermane ($GeH_4$) is mixed as a material gas at a predetermined pressure, a predetermined temperature, and a predetermined gas flow rate, an SiGe layer may be formed, and a heterojunction structure can be obtained. It is noted that the description of the n+ buried layer 2 is omitted from FIGS. 3B to 3H and FIG. 4 in order to simplify the figures.

Figure 3C:
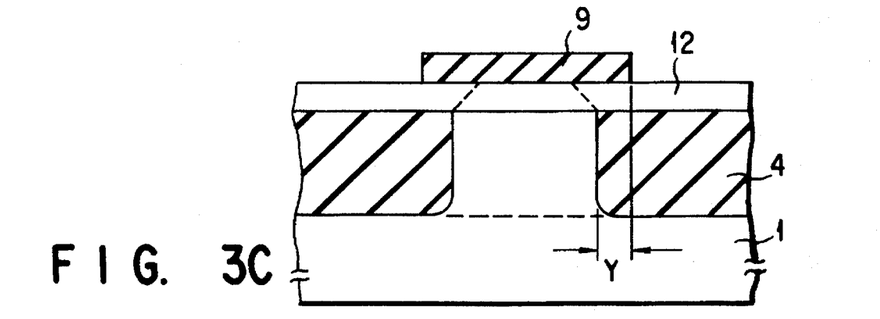

After that, as shown in FIG. 3C, the insulation film whose thickness is 50 to 100 nm is deposited on the base region 12, and patterned to be a predetermined shape, whereby the etching stopper film 9 is formed. The end portion of the etching stopper film 9 extends to the upper portion of the buried insulation film 4. In other words, as shown in the FIG. 3C, a distance Y is provided between the end portion of the etching stopper film 9 and that of the buried insulation film 4. The distance Y may be normally set to 0.05 to 0.1 µm. As the etching stopper film 9, a film, which has a high etching selectivity ratio to the material of the side wall spacer to be formed later, is desirably used. Also, a film, which can be removed by use of wet etching whereby the base region 12 is not damaged, is desirably used. More specifically, an oxide film or a composite film in which a nitride film is formed on an oxide film may be used. In this embodiment, an oxide film is used.

Figure 3D:
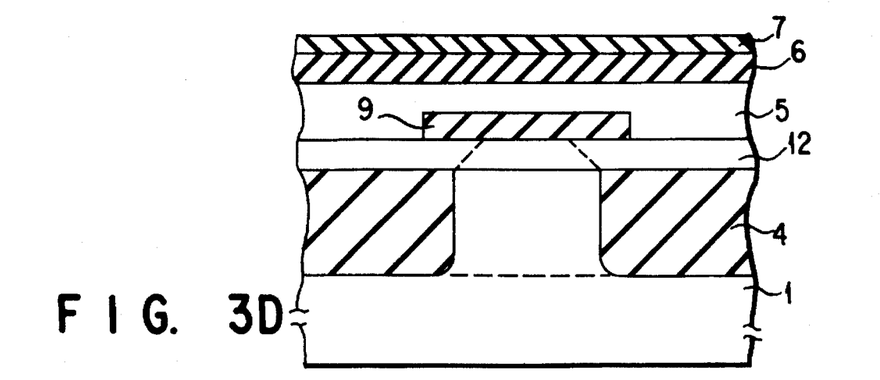

Subsequently, as shown in FIG. 3D, a polycrystalline silicon layer whose thickness is 100 to 200 nm is deposited by use of CVD, and p-type impurity material such as boron is ion-implanted, so that the base lead region 5 is formed. In place of ion-implantation of boron, there may be deposited polycrystalline silicon to which boron is already doped. Thereafter, the oxide film 6 having a thickness of 100 nm and the nitride film 7 having a thickness of 50 nm are sequentially deposited by use of CVD.

Figure 3E:
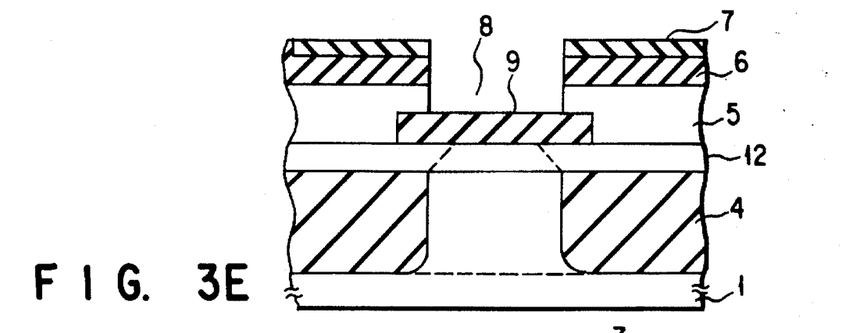
Figure 3F:
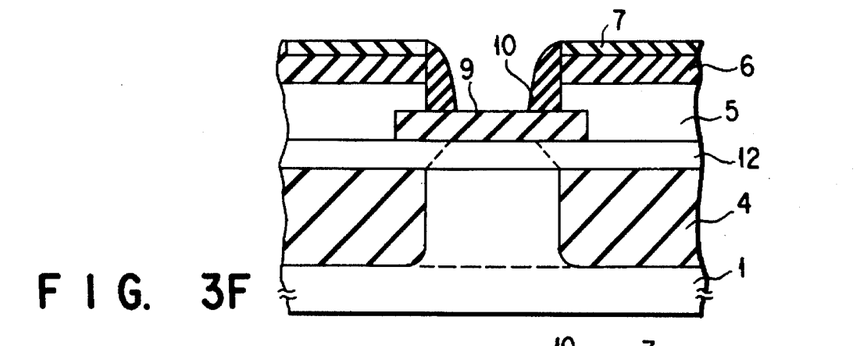
Figure 3G:
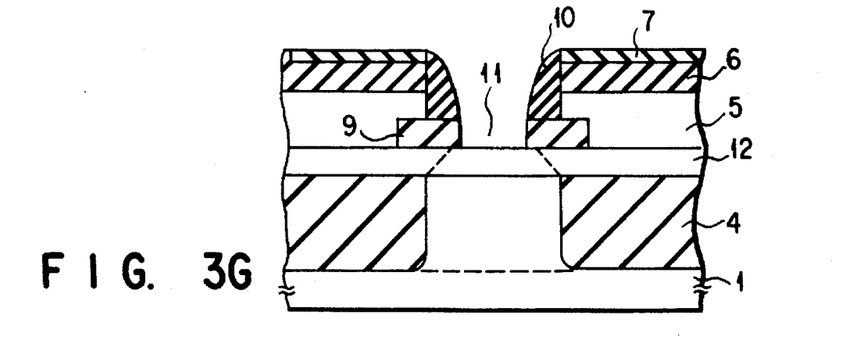

Then, as shown in FIG. 3E, a predetermined lithography processing is performed, and the first opening 8 is formed above the etching stopper 9 to be through the nitride film 7, the oxide film 6, and the base lead region 5. The size of the opening is set to, for example, 0.5×1.3 µm$^2$, which is the same as the size of the collector. Sequentially, an insulation material such as a nitride film is deposited on the entire surface to have a predetermined thickness, and is etched by means of reactive ion etching. Thereby, the side wall spacer 10 is formed as shown in FIG. 3F. The thickness of the side wall spacer 10 is set to 0.15 µm along the surface of the etching stopper 9. Thereafter, as shown in FIG. 3G, the etching stopper film 9 is selectively removed, so that the second opening 11 where an emitter is to be formed is formed. The opening 11 is designed to be opened onto the monocrystal region of the base region 12. The size of the opening 11 is set to 0.2×1.0 µm$^2$. The width, which is sandwiched by dotted lines showing the both-side boundaries of the monocrystal region, can be set to be substantially the same as the width of the collector at the upper surface of the base region 12 by suitably selecting the manufacturing conditions. In this case, the size of the above collector and that of an emitter, which is formed in the next process, can be substantially the same with each other, and a transistor having an extremely excellent characteristics can be obtained.

Figure 3H:
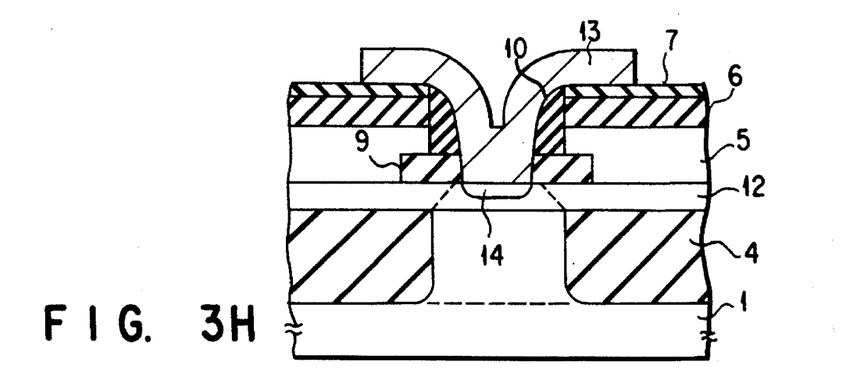

Thereafter, as shown in FIG. 3H, the polycrystalline silicon film 13 having a thickness of 100 to 200 nm is deposited on the entire surface, and arsenic is ion-implanted thereto. Thereafter, the thermal processing is performed thereto, and arsenic is diffused in the base region 12, so that the emitter region 14 is formed. In place of the ion-implantation of arsenic, it is possible to use polycrystalline silicon in which arsenic is already doped. Also, in place of polycrystalline silicon, silicon crystal in which arsenic is doped may be epitaxially grown. Moreover, in place of arsenic, an n-type impurity material such as phosphorus may be used.

Thereafter, a predetermined metal electrode is formed by use of a well-known technique, and an emitter/base electrode of the bipolar transistor is formed. The collector electrode, which is not shown in the figures, is formed on the outside of the buried insulation film 4, and connected to the collector region 3 through the n+ type buried layer 2 as shown in FIG. 2B.

Figure 4:
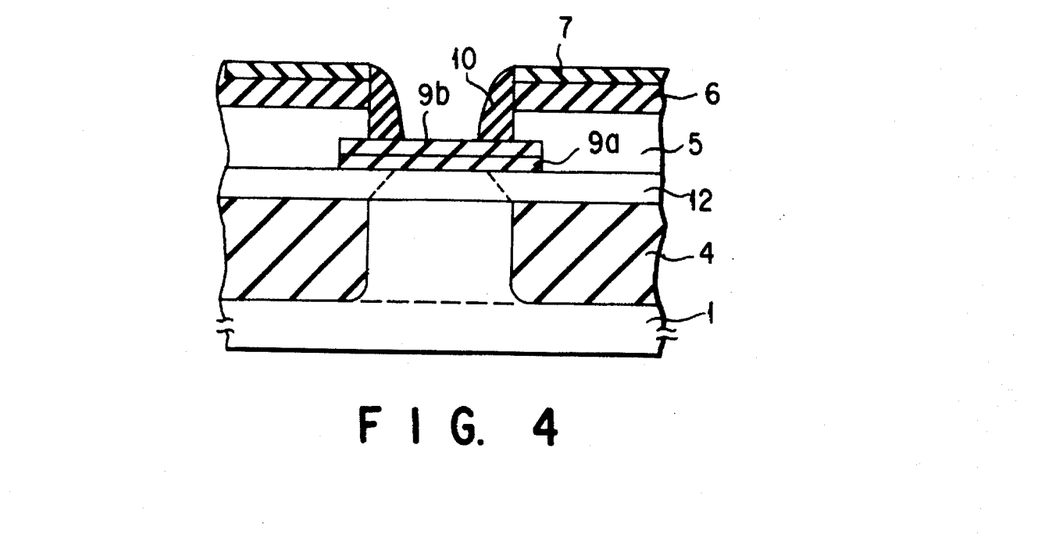
FIG. 4 is a cross sectional view of a transistor of a modification of the first embodiment in a middle step of manufacturing.

FIG. 4 shows a modification of the first embodiment in which a composite film is used as an etching stopper film. FIG. 4 is a cross sectional view of the transistor showing the manufacturing step corresponding to FIG. 3E. In the figure, the etching stopper film 9 is formed in the form that a nitride film 9b is layered on an oxide film 9a. At this time, the side wall spacer 10 is formed of an oxide film, and the condition of the reactive ion etching is set such that the oxide film is etched more easily than the nitride film. In this way, the structure of the etching stopper 9 may be changed, depending on the material to be used for the side wall spacer. There is also a case in which an oxide film is formed on a nitride film. In the case of FIG. 4, the thickness of the oxide film 9a may be set to 30 nm, and the thickness of the nitride film 9b may be 70 nm.

According to the above-explained embodiment of the present invention, by use of a non-selective epitaxial growth technique, there is no need for providing the distance X1, which is conventionally necessary to make contact with the base lead region 5. On the other hand, there is need for providing the distance X2 in the present invention as well. However, this does not cause the collector region 3 to be enlarged.

More specifically, in the prior art, the collector region 3 must be enlarged in order to provide the sum of distances X1 and X2 (X1+X2) because of the necessity for the positioning allowance in the lithography processing and the contact with the base lead electrode. According to the embodiment of the present invention, since the end portion of the etching stopper film 9 is positioned above the buried insulation film 4, it is unnecessary to estimate the positioning allowance (X1+X2), and the collector region 3 can be formed to have substantially the same size as the emitter region 14. This is because silicon crystal is grown on not only the collector region 3 but also the buried insulation film 4 by the non-selective epitaxial growth technique.

Figure 5:
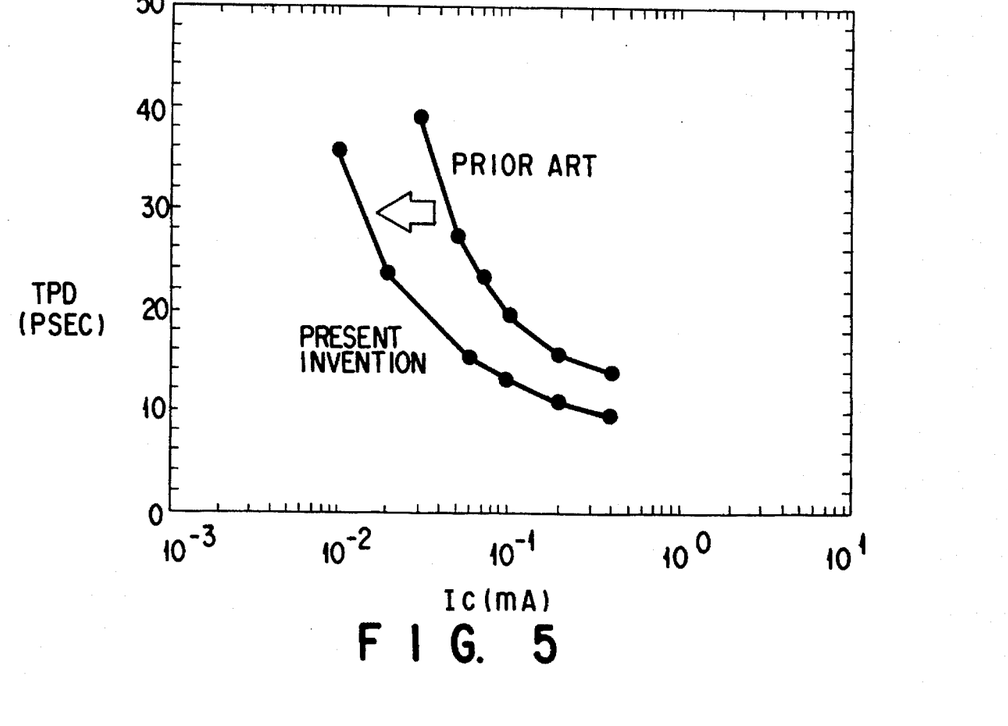
FIG. 5 is a characteristic plot showing one example of a signal delay characteristic of an ECL to which the transistor of the present invention is applied.

Therefore, the transistor area is largely reduced, so that capacitance between the base and the collector is made small, and the circuit performance is considerably improved. For example, in the case that the emitter area is the same, the power consumption in the transistor of the present invention is reduced to about 50% as compared with the conventional case. Moreover, FIG. 5 is an example showing the comparison between an ECL which the present invention is applied to and a prior art ECL in terms of the relationship between collector current Ic and delay time Tpd. In the case of the same collector current, it can be understood that Tpd is 30 to 50% improved. In the above comparison, the emitter area of the prior art is 0.2×1.0 µm$^2$ and a capacitance between the base and the collector of the prior art is 2.0 fF, and the emitter area of the present invention is the same as the prior art, and a capacitance between the base and the collector of the present invention is 1.2 fF. As mentioned above, according to the present invention, a capacitance between a base and a collector can be reduced without changing a size of an emitter area.

(Second Embodiment)

Figure 6:
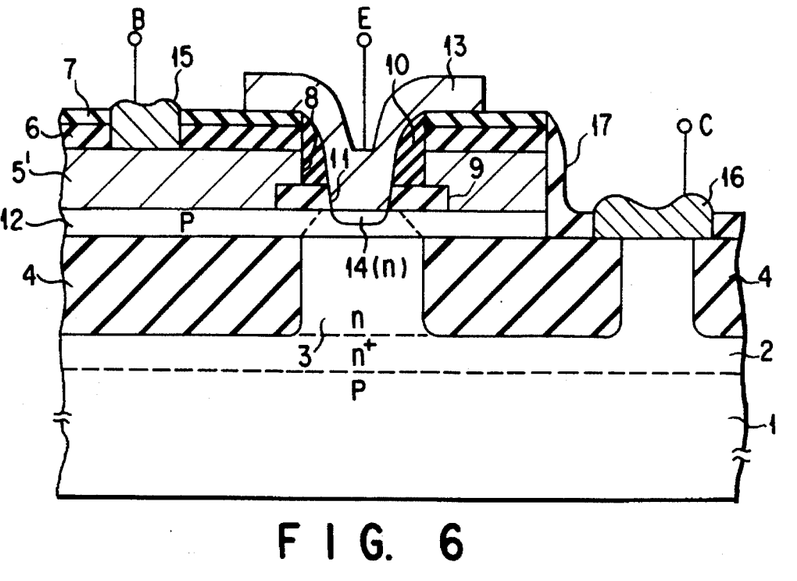
FIG. 6 is a cross sectional view showing an npn type bipolar transistor structure of a second embodiment of the present invention.

FIG. 6 is a cross sectional view showing a semiconductor device of a second embodiment of the present invention, which is a modification of the first embodiment. According to the second embodiment, a base lead region 5' is formed of tungsten, which has a high melting point. Due to this, the base resistance is more reduced, and the high-speed performance of the transistor can be further improved. Regarding the method of forming the base lead region 5', in place of polysilicon, tungsten may be formed to have a thickness of 100 to 200 nm by use of sputtering in FIG. 3D of the first embodiment. It is noted that other high melting point metals such as molybdenum, tungsten silicide and molybdenum silicide may be used in place of tungsten.

(Third Embodiment)

Figure 7:
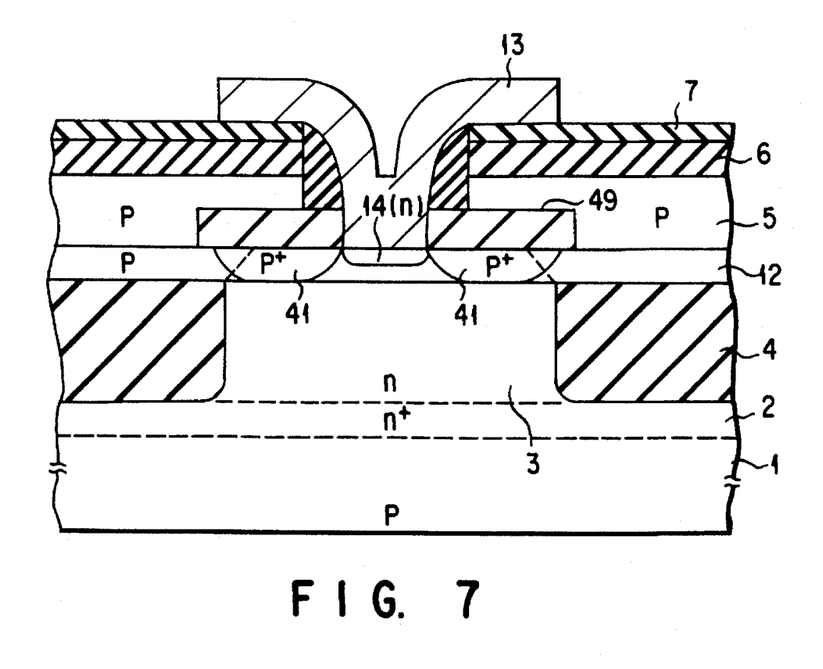
FIG. 7 is a cross sectional view showing an npn type bipolar transistor structure of a third embodiment of the present invention.

FIG. 7 is a cross sectional view showing the structure of an npn type bipolar transistor of a third embodiment of the present invention. In the first embodiment, there is a possibility that a resistance of the base region will increase the base resistance since the film thickness of the base region just below the etching stopper film 9 is thin as shown in FIG. 2B. In the third embodiment, as shown in FIG. 7, as an etching stopper film 49, there is used an oxide film containing an impurity material, e.g., boron, which is the same impurity material as is used in forming the base, and the heating processing is performed to the oxide film. Thereby, impurity concentration of the region 41 just below the etching stopper film 49 is selectively increased and the rise of the base resistance can be controlled, and the circuit performance can be improved.

The present invention is not limited to the above-explained embodiments, and various modifications can be attained in the range without deviating from the gist of the invention. The above embodiments explained the npn type bipolar transistor. However, it is of course that the present invention can be applied to a pnp type bipolar transistor. Moreover, the first semiconductor region can be used as an emitter, and the third semiconductor region can be used as a collector. Also, the material of each film and the condition such as a film thickness, etc. can be suitably changed, depending on the use.

As mentioned above, according to the present invention, the base region is formed by a non-selective epitaxial growth technique, and the end portion of the second insulation film is extended to the upper portion of the insulation film. Thereby, there can be solved the problem in relation to the positioning allowance in the lithography processing in the conventional transistor having a base formed by a selective epitaxial growth technique. Also, there can be eliminated the limitation of miniaturizing the device caused by providing the contact region between the base and the base lead electrode. As a result, there can be realized a semiconductor device and manufacturing method thereof wherein the device can be miniaturized and a capacitance between a base and a collector can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate having a main surface;

a first semiconductor region of a first conductivity type, formed on said main surface of said semiconductor substrate, said first semiconductor region being surrounded with a first insulation film;

a second semiconductor region of a second conductivity type, formed on said first insulation film and said first semiconductor region by an epitaxial growth technique;

a second insulation film, formed on said second semiconductor region, an end portion of said second insulation film being positioned just above said first insulation film, and having an opening at a central portion thereof to be positioned just above said first semiconductor region; and a third semiconductor region of a first conductivity type formed on a surface of said second semiconductor region exposed through said opening of said second insulation film.

2. The semiconductor device according to claim 1, wherein said first semiconductor region is a collector, said second semiconductor region is a base, and said third semiconductor region is an emitter, whereby a bipolar transistor is formed.

3. The semiconductor device according to claim 1, wherein said second semiconductor region comprises a monocrystal semiconductor layer formed on said first semiconductor region and a polycrystalline semiconductor layer formed on said first insulation film, and at least one part of a boundary between said monocrystal region and said polycrystalline region just under said second insulation film.

4. The semiconductor device according to claim 1, wherein a width of said first semiconductor region is substantially the same as that of said third semiconductor region.

5. The semiconductor device according to claim 1, wherein a surface portion of said second insulation film is formed of one of an oxide film and a nitride film.

6. The semiconductor device according to claim 1, wherein said second insulation film is an oxide film containing an impurity material whose conductivity type is the same as that of an impurity material included in said second semiconductor region of the second conductivity type.

7. The semiconductor device according to claim 1, further comprising a fourth semiconductor region of a second conductivity type, whose impurity concentration is higher than that of said second semiconductor region, in said second semiconductor region just under said second insulation film.

8. A semiconductor device comprising:

a semiconductor substrate having a main surface;

a first semiconductor region of a first conductivity type, formed on said main surface of said semiconductor substrate, said first semiconductor region being surrounded with a first insulation film;

a second semiconductor region of a second conductivity type, formed on said first insulation film and said first semiconductor region by an epitaxial growth technique;

a second insulation film, formed on said second semiconductor region, an end portion of said second insulation film being positioned just above said first insulation film, and having an opening at a central portion thereof to be positioned just above said first semiconductor region;

a third semiconductor region of a first conductivity type formed on a surface of said second semiconductor region exposed through said opening of said second insulation film; and a conductive layer formed on at least one portion of a peripheral portion of said second insulation film and on said second semiconductor region other than a region covered by said second insulation film and said third semiconductor region.

9. The semiconductor device according to claim 8, wherein said conductive layer is formed of a semiconductor layer of a second conductive type.

10. The semiconductor device according to claim 8, wherein said conductive layer is formed of a high melting point.

11. The semiconductor device according to claim 8, wherein said first semiconductor region is a collector, said second semiconductor region is a base, and said third semiconductor region is an emitter, whereby a bipolar transistor is formed.

12. The semiconductor device according to claim 8, wherein said second semiconductor region comprises a monocrystal semiconductor layer formed on said first semiconductor region and a polycrystalline semiconductor layer formed on said first insulation film, and at least one part of a boundary between said monocrystal region and said polycrystalline region exists just under said second insulation film.

13. The semiconductor device according to claim 8, wherein a width of said first semiconductor region is substantially the same as that of said third semiconductor region.

14. The semiconductor device according to claim 8, wherein a surface portion of said second insulation film is formed of one of an oxide film and a nitride film.

15. The semiconductor device according to claim 8, wherein said second insulation film is an oxide film containing an impurity material whose conductivity type is the same as that of an impurity material forming said second semiconductor region of the second conductivity type.

16. The semiconductor device according to claim 9, further comprising a fourth semiconductor region of a second conductivity type, whose impurity concentration is higher than that of said second semiconductor region, in said second semiconductor region just under said second insulation film.

* * * * *